(12) United States Patent
Wang (10) Patent No.: US 7,737,870 B1
(45) Date of Patent: Jun. 15, 2010

(54) BIT-STREAM HUFFMAN CODING FOR DATA COMPRESSION

(75) Inventor: Phil Yonghui Wang, Nepean (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 15 days.

(21) Appl. No.: 12/204,788

(22) Filed: Sep. 4, 2008

Related U.S. Application Data (60) Provisional application No. 60/967,410, filed on Sep. 4, 2007.

(51) Int. Cl.
*H03M 7/40* (2006.01)
(52) U.S. Cl. .................................... 341/65; 341/50
(58) Field of Classification Search ............ 341/50, 341/51, 65, 67, 106, 107
See application file for complete search history.

(56) References Cited

U.S. PATENT DOCUMENTS 4,906,991 A * 3/1990 Fiala et al. ............... 341/51
5,583,500 A * 12/1996 Allen et al. .............. 341/107
7,538,696 B2 * 5/2009 Laker et al. ............... 341/51

* cited by examiner

*Primary Examiner*—Brian Young
(74) *Attorney, Agent, or Firm*—Anderson Gorecki & Manaras LLP (57) ABSTRACT

Bit-stream Huffman coding may be used for data compression to quickly and efficiently compress relatively small and large datasets. A symbol used in data compression may not be a byte or 8 bits. Rather it has any number of bits. For a certain dataset, a symbol has a dynamic number of bits according to the data size. A symbol may have less than 8 bits for a small dataset, or more than 8 bits for a large dataset. For rapid processing, a large dataset may be broken into smaller datasets that are fast encoded in parallel. Accordingly, the Huffman encoding inputs from a bit-stream instead of a conventional byte-stream and outputs a bit-stream. In particular, bit-stream Static and Adaptive Huffman codings are presented with extended algorithms. Hardware implementation with parallel Huffman encoders and decoders is also illustrated for fast network data compression.

20 Claims, 3 Drawing Sheets

Figure 5

BIT-STREAM HUFFMAN CODING FOR DATA COMPRESSION

CROSS-REFERENCE TO RELATED APPLICATIONS

This application claims priority to U.S. Provisional Patent Application No. 60/967,410, filed Sep. 4, 2007, entitled "DYNAMIC BIT-STREAM HUFFMAN CODING FOR FAST NETWORK FLOW DATA COMPRESSION, the content of which is hereby incorporated herein by reference. This application is also related to co-pending U.S. patent application Ser. No. 12/182,968, filed Jul. 30, 2008, entitled "METHOD AND APPARATUS FOR ETHERNET DATA COMPRESSION", the content of which is hereby incorporated herein by reference.

BACKGROUND

Data communication networks may include various routers, switches, bridges, and other network devices, coupled to and configured to pass data to one another. These devices will be referred to herein as "network elements." Data is communicated through the data communication network by passing Protocol Data Units (PDUs), such as Internet Protocol packets, Ethernet Frames, data cells, segments, or other logical associations of bits/bytes of data, between the network elements by utilizing one or more communication links between the network elements. A particular protocol data unit may be handled by multiple network elements and cross multiple communication links as it travels between its source and its destination over the network.

Figure 1:
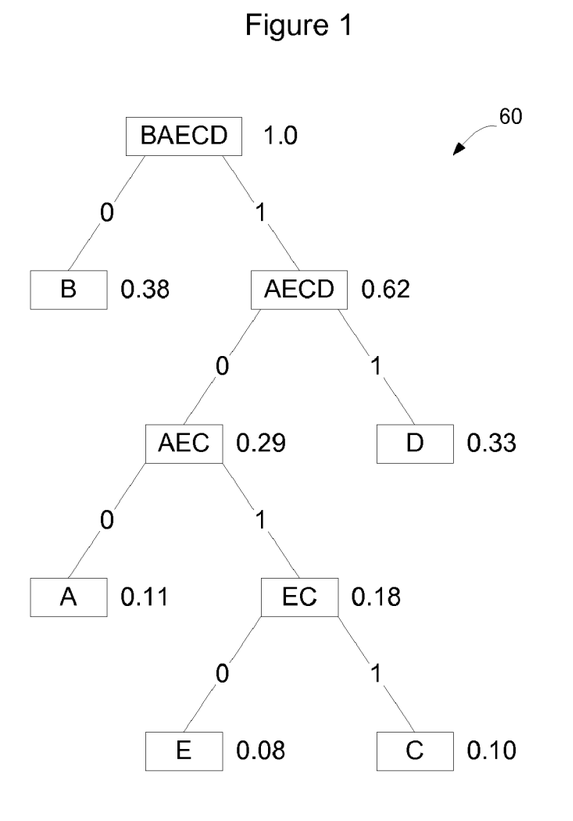
FIG. 1 is a functional block diagram of an example Huffman tree.

Compression may be used to reduce the amount of data that must be transmitted on a network. One common form of compression is known as Huffman coding. Although Huffman coding is well known in the art, a brief explanation will be provided to facilitate an understanding of the invention. In Huffman coding, a dataset is first assessed to determine the probability of each symbol occurring. For example, as shown in FIG. 1, assume that a dataset includes five different codes, which are represented by the letters A, B, C, D, and E. The first step will be to determine the respective probability of each letter occurring. In this example, it will be assumed that the probability of A occurring is 0.11, B=0.38, C=0.10, D=0.33, and E=0.08. Each of these letters will be assumed to be a symbol. Note, in this example, the sum of the probabilities of the letters equals 1.00.

The Huffman algorithm uses the symbol probabilities to form a Huffman tree 60 as shown in FIG. 1. Specifically, the Huffman code will find the two symbols with the smallest probability and combine them into a new symbol. The new symbol will represent both symbols and have the sum of the probabilities of the two symbols. In this example, symbols E and C have the two lowest probabilities. Thus, a new symbol will be created EC which has a probability of 0.18. This process will be repeated for each symbol (including the newly created symbols such as symbol EC). Thus, for example, once the new symbol EC has been created with a probability of 0.18, the two symbols with the lowest probability will be selected and combined. In this instance, symbol A has probability 0.11 and symbol EC has a probability 0.18. These symbols will be combined to create a new symbol AEC with a probability of 0.29. This process continues combining symbols to form a tree as shown in FIG. 1.

Within the tree, by convention, each time the tree branches the left branch will be assigned a 1, and the right branch will be assigned a 0. The code for a particular symbol is thus the combination of 1s and 0s that is required to traverse the tree to reach the symbol. In the tree of FIG. 1, symbol A has a code "100", symbol B has a code "0"; symbol C has a code "1011"; symbol D has code "11"; and symbol E has code "1010". Each code uniquely defines a particular letter. The symbols can have different code lengths, as well, since a particular bit pattern will terminate uniquely on one leaf of the tree. Accordingly, more frequently used symbols may be encoded using fewer bits to thus reduce the size of the data that must be transmitted.

To optimize encoding of a particular dataset, the transmitter will scan the dataset to determine the relative probabilities of the symbols occurring in the dataset. This allows the optimum tree to be created for that dataset so that the compression algorithm compresses the dataset in an optimal fashion. To enable the dataset to be decoded, the transmitter transmits a dictionary describing the codes used for the symbols included in the dataset along with the compressed data. The dictionary describes the symbols and probabilities so that the decoder can form a Huffman tree to decode the data contained in the payload. By transmitting a dictionary that is specific to the dataset, the payload may be encoded optimally. The receiver uses the dictionary to build the Huffman tree, and then can use the tree to decode the compressed data. This is commonly referred to as a static Huffman compression process.

Another way that Huffman coding may be implemented is to have the Huffman tree created without transmission of the dictionary. This process requires the encoder to transmit a specific code commonly referred to as a Not Yet Transmitted (NYT) code. When a decoder sees a NYT code, it recognizes that a new symbol is being transmitted to be added to its Huffman tree. In this way the encoder and decoder may build Huffman trees as symbols are encountered. The inclusion of NYT codes in the encoded output, like inclusion of a dictionary, contributes overhead to the compression process. This is commonly referred to as an adaptive Huffman compression process.

Huffman coding works generally for large datasets because, as the size of the dataset increases, the amount of overhead associated with the dictionary becomes comparatively low. Unfortunately, for small datasets, the overhead associated with the compression dictionary may outweigh the benefits obtained from compression, because the combined size of the compressed dataset plus dictionary may be larger than the original size of the uncompressed dataset.

Thus, Huffman coding compresses better with larger sized datasets. However, as the size of the dataset increases, the processing time required to process the dataset also increases. In communication systems and networks, a longer processing time means longer network delay. For example, as described above, since the static Huffman process is required to first scan the dataset to determine the relative probability of each symbol occurring, increasing the size of the dataset increases the amount of data that must be scanned and also results in a more optimized Huffman tree. Although there are adaptive Huffman encoding methods that may eliminate the initial scanning step and allow the Huffman tree to be built over time, as the dataset increases in size, the overall amount of time it takes to rebuild the Huffman tree for each symbol may slow the compression process. In either instance, where it is desirable to encode data in real time, such as where the encoding process is to be used on time sensitive network traffic or other time sensitive data transfers, reducing the Huffman coding time may be equally as important as compressing network data.

As noted above, communication networks generally include network elements that transmit protocol data units between each other. The protocol data units may vary in size depending on the particular types of protocols being used by the network elements to exchange data. A normal Ethernet frame may have a data size from 46 to 1500 bytes. A jumbo Ethernet frame may have a big data size such as 9000 bytes. An IP packet may carry a TCP segment up to 64 KB, but it is not uncommon for IP packets to be on the order of 250 bytes.

Unfortunately, because of the overhead associated with Huffman coding, Huffman coding often does not work well for compression of small sized network packets. For example, assume that an IP packet has a fixed symbol size of one byte (8 bits). Thus, the packet has potentially 256 symbols. If every symbol occurs at least once, the dictionary size will be 256+ bytes. If the IP packet is 1024 bytes long, the impact of the dictionary on the overall compressed packet is 25% (256/1024). Assuming an MTU of 1500 bytes, the dictionary impact on the largest size packet will be 256/1500 or approximately 17%. Depending on the compressibility of the data, this overhead may significantly reduce the effectiveness of the compression process, possibly rendering the overall length of the compressed data larger than the original length of the data.

Additionally, for larger datasets, such as Transmission Control Protocol (TCP) protocol data units and other types of larger protocol data units such as jumbo frames using traditional Huffman coding may require significant processing time on a dedicated processor. While delays of this nature may be tolerable in certain instances, in other instances where the transmission is time sensitive the delay associated with compression using standard Huffman coding may prevent the dataset from being compressed for transmission across the network. Accordingly, although it would be advantageous to compress data for transmission on the network, conventional Huffman coding often is not suitable for compressing small datasets due to excessive overhead, or for compressing large datasets because of the relatively large amount of processing time required to compress the large datasets using the standard Huffman coding process.

SUMMARY

Bit-stream Huffman coding may be used for data compression to quickly and efficiently compress relatively small and large datasets. A symbol used in data compression is not required to be a byte or 8 bits. Rather it may have any number of bits. For a certain dataset, a symbol has a dynamic number of bits according to the data size. A symbol may have less than 8 bits for a small dataset, or more than 8 bits for a large dataset. For rapid processing, a large dataset may be broken into smaller datasets that are fast encoded in parallel. Since the number of bits in a symbol is selected independent of the logical grouping of bits as bytes in the dataset, a particular symbol may have only part of a byte or may include bits from more than one byte. The symbols thus have no correlation to the original bytes contained in the dataset.

Once the symbol length has been established based on the length of the dataset, a static or adaptive Huffman compression process is used to compress the dataset. For example, a static Huffman coding process may be used in which a Huffman dictionary is first created for the dataset and then used to encode the data. Alternatively, an adaptive Huffman coding process may be used in which the Huffman tree is updated as new symbols are encountered without first creating the Huffman dictionary. The bit encoding process may be used to encode small datasets such as are contained in payloads of individual protocol data units such as IP packets or Ethernet frames. The bit encoding process may also be used to compress larger datasets by causing the larger datasets to be broken into smaller pieces and individually encoding each of the smaller pieces.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention. For purposes of clarity, not every component may be labeled in every figure. In the figures.

DETAILED DESCRIPTION

The following detailed description sets forth numerous specific details to provide a thorough understanding of the invention. However, those skilled in the art will appreciate that the invention may be practiced without these specific details. In other instances, well-known methods, procedures, components, protocols, algorithms, and circuits have not been described in detail so as not to obscure the invention.

Figure 3:
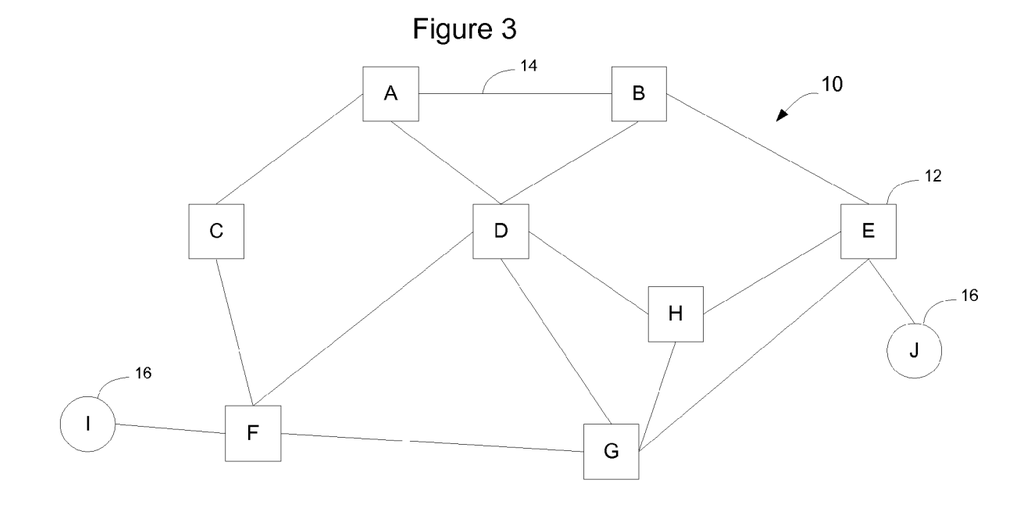
FIG. 3 is a functional block diagram of an example communication network.

FIG. 3 is a functional block diagram of an example communication network 10 which, in one embodiment, may be an Ethernet network. Many different types of communication networks exist, such as Internet Protocol (IP) networks, MultiProtocol Label Switching (MPLS) networks, and wireless networks in which data is transmitted over an air interface rather than physical communication link. The bit stream encoding process described herein may be used to encode protocol data units in many different network environments. For example, wireline and optical network elements may implement these processes to compress Ethernet, Internet Protocol, Transmission Control Protocol, and other types of network traffic. Similarly, wireless 3G/4G products implementing WiMAX, Long Term Evolution (LTE), and General Packet Radio Service (GPRS) may use these compression processes to compress wireless network traffic. Many other types of networks may also compress data using these processes as well.

Additionally, the compression processes described herein may be used to rapidly compress larger datasets, such as data to be transmitted between end clients. For example, when a client has a large dataset such as a TCP flow that needs to be transmitted on a communication network, rather than compressing the TCP flow using a single Huffman compression process, the dataset may be broken into pieces that may be individually compressed for transmission on the network.

Thus, the compression processes described herein may be used in several different contexts and the invention is not limited to use of the compression process to compress individual protocol data units on the network.

As shown in FIG. 1, the network 10 in this example includes a plurality of network elements 12 interconnected by links 14. Network subscribers 16 (also referred to as clients I, J) may transmit data over the network 10 by forwarding data to the edge network elements 12, which will in turn forward data on the links 14 across the network. Clients I, J can be a user computer or end device, and communicate each other through the network. Network elements E and F are at the network edge and connect clients I and J to the network. Network elements A, B, C also provide network access to other clients (not shown). Other network elements D, G, H are backbone and core network devices, which can be Ethernet switches, IP routers, or other types of network elements, and serve to interconnect the edge network elements. The network subscribers 16 may be connected to the edge network elements by wired links or by wireless access links.

Figure 4:
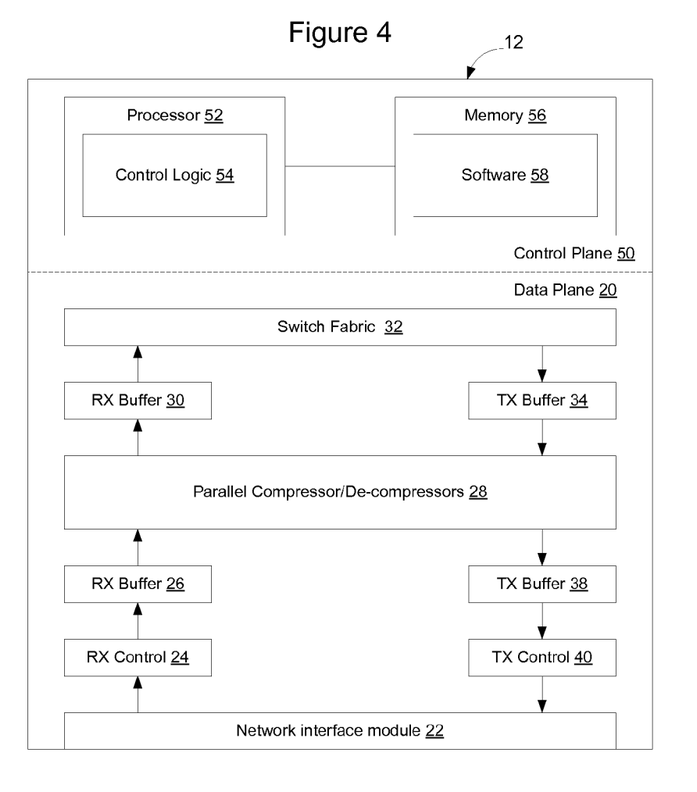
FIG. 4 is a functional block diagram of an example network element that may operate on the communication network of FIG. 3.

FIG. 4 illustrates an example of a network element such as an Ethernet switch, router, or computer, which may be used to implement an embodiment of the invention. The network element shown in FIG. 4 may be any type of network element or computer that is required to compress data for transmission or storage. In the embodiment shown in FIG. 4, the network element includes a data plane 20 and a control plane 50. The data plane 20 generally includes hardware configured to process data under the control of the control plane. In the example network element shown in FIG. 4, the data plane 20 includes network interface module 22 that receives and transmits data units on a network such as the communication network of FIG. 3. When a data unit is received, it is forwarded to an ingress (RX) control 24 and from there to an ingress (RX) buffer 26. The RX control 24 determines whether the data unit is to be compressed or decompressed.

If a data unit is to be compressed, it will be passed from the RX buffer 26 to parallel compressors/de-compressors 28 to be compressed and then stored to an RX buffer 30. The compressed data unit in the RX buffer 30 will then be output from the compression engine for further processing. For example, in the example shown in FIG. 4, the compressed data unit may be input to a switch fabric 32 to be switched (to another network interface module) within the network element prior to being transmitted from the network element via network interface module 22.

On the egress from the switch fabric, the data unit will be transmitted to a first Transmit (TX) buffer 34. A TX control 40 will check determine if the data unit should be decompressed. If a data unit is to be decompressed, it will be passed from the TX buffer 34 to parallel compressor/decompressor 28 to be decompressed and then stored to a TX buffer 38. The decompressed data unit will then exit the decompression processor for further processing on the network element. In the example shown in FIG. 4, the decompressed data unit is shown as being passed to the network interface module 22 for transmission on the communication network.

FIG. 4 shows an embodiment in which compression is performed at ingress (before encountering the switch fabric) and decompression is at egress (after the switch fabric). The compression or decompression of the data units may happen at ingress, egress, both, or simply in connection with other processes occurring on the network element. Although FIG. 4 shows an implementation in which the compression/decompression process is operating on data units received from physical network ports and which outputs the data for transmission onto the network via a network interface module, the invention is not limited in this manner as the compression/decompression processes described herein may be used in other contexts as well.

The control plane 50 of the network element 12 contains a processor 52 containing control logic 54 configured to control operations of the data plane in the network element 12. Where the data plane is implemented to handle flows of data on the communication network 10, the control plane may select, for example, particular flows of data to be compressed or decompressed. Where the data plane is implemented to compress larger datasets for transmission on the network, the data plane may be implemented as a compression accelerator adapted to compress data prior to transmission of the data on the network. The separation, in this instance, may be a logical separation in that both the control plane and data plane may be implemented as different processes on the same CPU.

Data and instructions associated with programs that enable the network element to control the data plane to implement the compression/decompression processes described herein may be defined using one or more computer programs (software 58) in memory 56 that are used to configure control logic 54 in processor 52. When the compress/decompress control logic is loaded to the processor 52, the processor may control or configure how the parallel compressor/decompressor 28 works. The network element 12 may contain other software, processes, and stores of information to enable it to perform the functions described herein related to compression and to perform other functions commonly implemented in a network element on a communication network such as the communication network of FIG. 3.

Compression of a dataset, and decompression of the dataset, may happen on opposite sides of the network, on opposite sides of a network tunnel, on opposite sides of a link, on opposite sides of a TCP connection, on computers configured to communicate across a communication network, at ingress/egress interfaces on a given network element or in other contexts. For example, a network element may compress a dataset as it is received to reduce the size of the dataset that is required to be handled by the network element, and then may decompress the dataset prior to transmitting the dataset on an egress interface. The compression/decompression process may therefore be utilized in many different contexts.

Where the dataset to be compressed is a protocol data unit, such as an Ethernet frame, or Internet Protocol (IP) packet, preferably the resultant compressed protocol data unit will have the same format as uncompressed protocol data units. For example, in the Ethernet context, the IEEE specifies the frame format of Ethernet frames. Preferably, where the Ethernet frames are compressed, they should have the same format as other Ethernet frames so that they are able to be handled by other Ethernet nodes that do not support compression. Since compressed protocol data units thus look similar to uncompressed protocol data units, it becomes necessary to enable network elements to identify which protocol data units are compressed. Several ways for nodes on a communication network to specify to each other which protocol data units contain compressed payloads, and to enable the network elements to determine when to compress protocol data units have been disclosed in co-pending U.S. patent application Ser. No. 12/182,968, filed Jul. 30, 2008, entitled "METHOD AND APPARATUS FOR ETHERNET DATA COMPRESSION", the content of which is hereby incorporated herein by reference.

Data may be compressed before entering the network. For example, an application running on client 16-J may want to send data to an application running on client 16-I. To reduce the size of the data that is transmitted on the network 10, it is well known that client 164 may compress the data before transmission. Since compression of a large dataset may take a relatively long amount of time using conventional Huffman compression, according to an embodiment of the invention larger datasets may be broken into pieces and individually compressed using the bit-stream Huffman compression processes described herein. By breaking the larger dataset into smaller pieces, and compressing each piece individually, compression of the larger dataset may be significantly accelerated. Specifically, since multiple pieces of the larger dataset may be compressed at the same time, the overall compression of the larger dataset may be implemented in parallel rather than serially to thus increase the rate at which the compression may occur. In addition, compression of smaller datasets is also advantageous in that the resultant Huffman tree that is created for the dataset is smaller and less complex. Thus, each individual piece may be compressed more quickly than it would be if it were to be compressed as part of the unified dataset. Accordingly, breaking the larger dataset into pieces is faster not only because the individual pieces may be processed in parallel, but each individual piece is also faster to compress than it would be if all of the pieces were to be compressed together.

As used herein, the term "relatively large dataset" refers to any dataset that may be broken into two or more pieces for compression, such that by breaking the dataset into pieces the amount of time it takes to compress the dataset is reduced when compared to compression of the entire dataset as a whole. Additionally, the term "relatively large dataset" implies that by breaking the dataset into two or more pieces, and compressing the individual pieces, the size of the pieces results in a smaller dataset than the size of the original dataset. Stated another way, if the overall size of the dataset is not reduced by breaking the dataset into two or more pieces and compressing each piece individually, but the overall size of the dataset would be reduced if it were compressed using the compression processes discussed herein when compressed as a unified dataset, then the dataset is not considered a "relatively large dataset". Typically, it may be expected that a relatively large datasets would have in excess of about 3000 bytes, although the particular cut-off range would need to be determined based on these functional definitions.

Where a network protocol data unit has a sufficiently small payload, the compression process may be used to compress protocol data unit without first dividing it into pieces. According to an embodiment of the invention, nodes 12 on the communication network 10 may compress the data in the payload portion of a protocol data unit separately from any data transmitted in any other protocol data unit, using the bit-stream static or adaptive Huffman coding. In this manner, the payload of any one protocol data unit may broken into a number of data pieces, and each piece may be individually compressed. Then, a new payload is assembled with those compressed data pieces and therefore formed a new PDU to transmit in the network. Later, the new PDU is restored to the original PDU, by decompressing its payload piece by piece and assembling the original PDU. In this manner, the payload of any one protocol data unit may be individually compressed as one or more independent pieces and, accordingly, individually decompressed at a later point in the network without reference to the payload of other protocol data units being transmitted on the network.

A normal protocol data unit such as an Ethernet frame has a payload that contains a byte array. Conventional compression processes such as normal Huffman compression operated using an 8 bit symbol such that each symbol corresponded to a byte of data. According to an embodiment of the invention, instead of looking at a dataset as containing a collection of bytes of data, the payload is instead read into a bit stream. Depending on the length of the bit stream, a symbol size which represents a number of bits is selected that is used to encode the bit stream. By using a symbol size that is selected according to the size of the dataset, it is possible to efficiently encode much smaller datasets than would otherwise be possible using a normal byte-by-byte Huffman coding process.

When a dataset is to be compressed, the length of the packet will be assessed to determine the correct symbol size. If the number of bits per symbol is "n", then the goal is for the number of symbols "s" used to express the payload to be less than $2^n$: $s \leq 2^n$.

Additionally, it is desirable to minimize the dictionary storage. Generally, the amount of space "d" required for the dictionary is $d \geq 2^n * n$. The smaller the number of bits per symbol, the smaller the dictionary size.

From an encoding perspective, the average code length c will be less than n, since not all of the symbols will require a full symbol. $c \leq n$. Thus, as the number of bits per symbol is decreased, the average size of the symbol should also be expected to decrease. The encoding ratio "r" may be expressed as the average symbol length c divided by the number of bits per symbol n: $r = c/n$. Thus, the encoding ratio r will decrease as the number of bits per symbol increases. A smaller encoding ratio means a higher compression efficiency.

Accordingly, by decreasing the symbol size, the size of the dictionary decreases which reduces the overhead associated with the compression process. However, reducing the symbol size also reduces the compression efficiency.

For example, assume that a dataset or a piece of a dataset is 1 Kbyte in length. If each byte is encoded separately, n=8. The dictionary storage is $2^n * n$ bits or $d = 2^8 * 8$ bits=256 bytes, which represents a 25% overhead. The average code length $c \leq 8$, and $r = \frac{1}{8}$. By contrast, if a smaller symbol is selected, such as a four bit symbol (n=4), the dictionary $d = 2^4 * 4$ bits=8 bytes, which represents a 0.8% overhead. The average code length $c \leq 4$, and $r = \frac{1}{4}$.

Depending on the particular implementation, it may be desirable for the overhead percentage to be maintained below about 5%. Other implementations may use lower percentages.

As noted above, by reducing the size of the dictionary associated with the coding processes, bit-stream encoding and dynamic symbol selecting technologies allow even a small amount of data, such as the amount of data typically contained in the payload of an Ethernet frame, to be compressed efficiently and safely. Since the resultant Huffman trees formed using the fewer symbols are also smaller and less complex, the compression process of a particular piece of data may also be performed more quickly than would be possible using more symbols. Accordingly, compression of larger data sets may be implemented by breaking the larger datasets in to smaller pieces which may be individually compressed using this compression process. When pieces of a dataset are individually compressed, each piece will have its own Huffman tree and dictionary.

As a precaution, once a dataset has been encoded, the size of the compressed dataset (dictionary plus encoded payload) may be compared with the original size of the original dataset to ensure that the compressed version is smaller than the original version. If the compression process does not reduce the size of the dataset, or does not reduce the size sufficiently to warrant the additional processing required to decompress the dataset at a later point in time, the original dataset may be transmitted instead of the compressed dataset.

Figure 5:
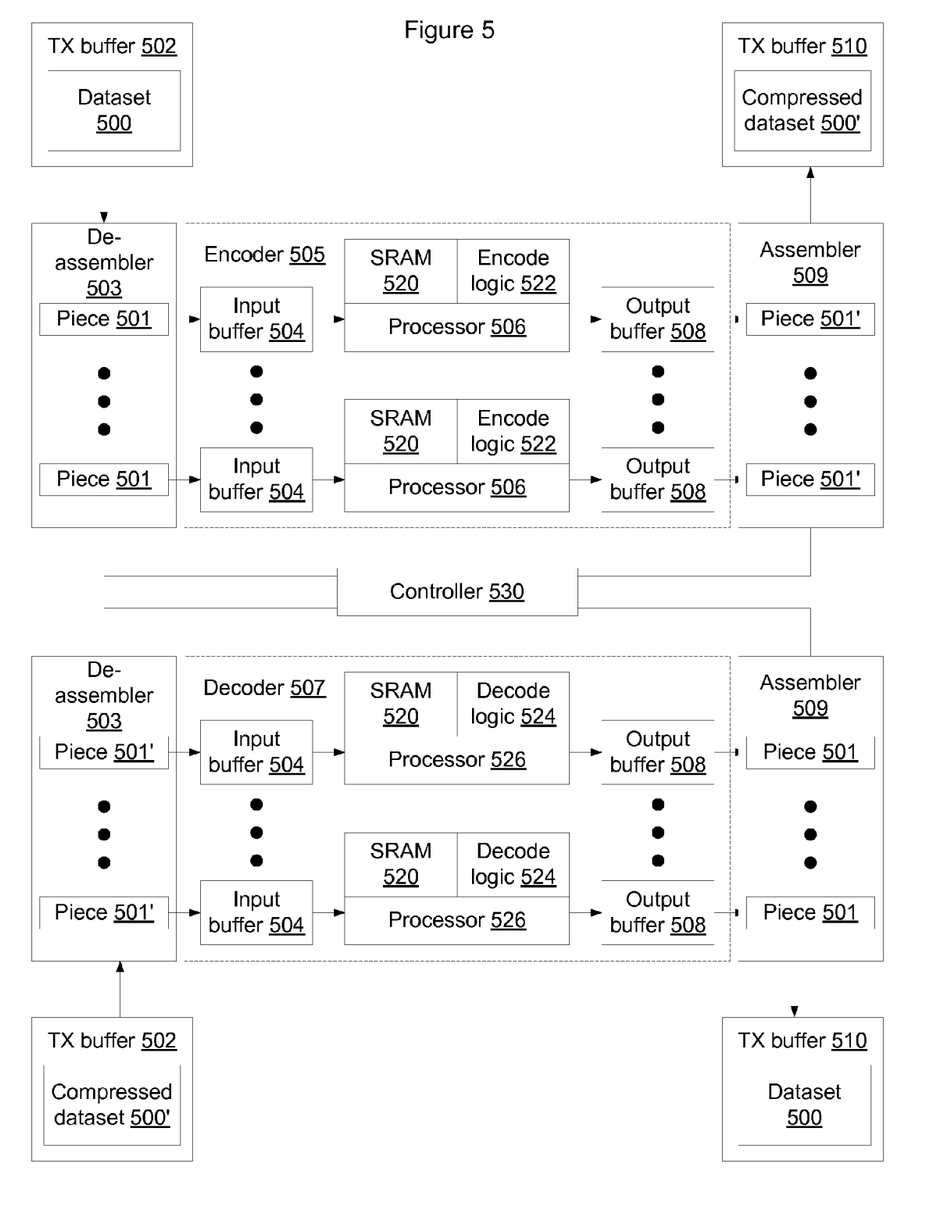
FIG. 5 is a functional block diagram of a hardware implementation of an encoder/decoder that may be used to compress and decompress individual protocol data units on a communication network.

FIG. 5 shows a hardware implementation in which parallel encoders and decoders may be used to encode and decode (compress and decompress) datasets. Where the dataset has a relatively large amount of data, the dataset 500 may be broken into pieces 501 for parallel encoding to enable fast data compression. Similarly when the dataset has been encoded in separate pieces, each of the separate pieces may be separately decoded in parallel using parallel decoders. Where the dataset is relatively small and does not need to be broken into pieces for encoding, such as when the payload of an individual protocol data unit is to be encoded, the protocol data unit is not required to be broken into pieces before encoding.

In the embodiment shown in FIG. 5, when a dataset 500 stored in a transmit buffer 502 is to be encoded, the dataset 500 will be passed to a de-assembler 503 which operates under the control of a controller 503 to break the dataset into pieces 501, each of which may be separately encoded by encoder 505.

The encoder 505 may have one, two, or multiple separate encoder tracks each of which may operate in parallel to encode pieces of the dataset. The de-assembler 503 operates under the control of the controller 530 to form appropriately sized pieces for compression by the encoder tracks. The size of the pieces is determined by the controller to enable the parallel encoder tracks to quickly and efficiently encode the individual pieces. In the illustrated embodiment, the controller has broken the dataset into several pieces, one for each encoder track in the encoder. The invention is not limited in this manner. For example, if a protocol data unit is to be compressed, the controller may cause the payload of the protocol data unit to remain a unitary piece in the deassembler 503. Thus, the deassembler may cause the dataset to be broken into fewer pieces than there are encoder tracks. As another example, a large dataset may need to be broken into many pieces such that the number of pieces exceeds the number of available encoder tracks in the encoder. Where the dataset is contained in a protocol data unit, the deassembler 503 may be specific for that type of protocol data unit.

Each of the encoder tracks has an input buffer 504 to receive data from the de-assembler 503. Each input buffer will pass the pieces of data to one or more processors 506 which will encode the piece of data and transmit the data to an output buffer 508. The encoded data will be transmitted to an assembler 509 which will reassemble the compressed pieces of data 501' to form a compressed dataset 500'. The compressed dataset will be transmitted to a transmit buffer 510. Where the compressed dataset is to be contained in a protocol data unit, the assembler 509 may be specific for that type of protocol data unit.

Each compressed piece of data 501' is an independent compressed data piece, when using the bit-stream Static or Adapative Huffman coding. Each piece is thus individually decodable using a bit-stream Static or Adaptive Huffman decompression process.

As described above, in a static Huffman encoding process the encoder creates a dictionary defining the Huffman tree that is then transmitted to the decoder along with the encoded data. As described below, in another embodiment an adaptive Huffman encoding process may be used which does not require a dictionary to be separated from the data and transmitted along with the encoded data.

The assembler 509 will perform a size check to determine whether the compressed dataset 500' is smaller than the original dataset 500. If it is, the dataset 500' will be transmitted to the transmit buffer 510. If not, the original dataset 500 may be transmitted instead of the compressed dataset 500'.

In FIG. 5, the encoder includes a static random access memory 520 containing encode control logic 522 to implement the encoding process. The processor uses the control logic to select a code size based on the length of the data to be encoded and encode the piece of the dataset provided to it by the input buffer 504. The control logic may be implemented as software or as hardware logic depending on the implementation.

Decompression follows a similar process. Specifically, when a transmit buffer 502 has a compressed dataset 500' to be decompressed, the TX buffer will pass the compressed dataset to a deassembler 503. The deassembler will separate the compressed dataset 500' into pieces 501' if the compressed dataset contains pieces that were separately encoded. Each piece will be separately decompressed using a parallel decompression track of a decoder 507.

Each decoder track is formed similar to an encoder track, in that each decoder track has an input buffer 504 to receive a piece of compressed data, a processor 526 running decode logic 524 stored in SRAM 520 to decompress the compressed data, and an output buffer 508 to store the decoded data for transmission from the decoder 507.

The decode logic 524 programs the processor 526 to take a compressed protocol data unit and extract the dictionary to build a Huffman tree. Alternatively, where the adaptive Huffman process is used, the decoder will build the Huffman tree over time from the compressed data itself. The processor will read the input bit stream to extract Huffman codes and thereby deduce symbols from the incoming bit stream. Since the Huffman coded bit stream relies on the particular bit order to specify the Huffman codes, and since it isn't trivial to determine in advance where one code stops and another begins, a single decoder is used to decode each piece of separately encoded data.

Decompressed data is passed from the output buffer 508 to an assembler 509 which operates under the control of the controller 530 to reassemble the decoded pieces to re-form the original dataset. The original dataset is then passed to a transmit buffer 510.

For static Huffman compression there are two different types of dictionaries which may be created for a given dataset—canonical and weighted. The dictionary type may be selected by looking to see which is smaller. The size of the weighted dictionary may be calculated as the product of the number of symbols S used to encode the dataset times the sum of the symbol size n and the number of bits to store the max symbol weight Lw: $Dw=S*\{n+Lw\} \leq S*2n$. The size of the canonical dictionary may be calculated as described above as $Dc=2^n*Lc \leq 2^n*n$, where Lc is the maximum code length.

The number of bits per symbol is optimized to make both Huffman dictionary storage and Huffman encoding ratio minimal. The dictionary storage includes the storage of all the symbols and their Huffman codes, and is compared against the data block size. The encoding ratio indicates the Huffman code efficiency.

Suppose that the number of bits per symbol is n and the number of used symbols is s, the minimal storage of a normal Huffman weight dictionary is:

$s*n$ (bits), for a symbol that has n-bits $s*\log_2(s)$ (bits), for a Huffman code, minimal when it's a balanced Huffman tree So, the total storage size (bits) of the Huffman weight dictionary is:

$$S=s*n+s*\log_2(s)=s*[n+\log_2(s)] \quad (1)$$

The Canonical Huffman code table is an alternative to the normal Huffman dictionary, and only stores the lengths of the canonical Huffman codes. For an n-bit symbol, the maximal length of a canonical Huffman code is less than or equal to n.

$$S' = 2^n * n \qquad (2)$$

In this equation, S' is used to estimate the canonical Huffman dictionary size, because the number of actual symbols is unknown without a count.

The measure of the symbol storage is its storage size compared against the data block size.

$$p = S/D * 100\% \qquad (3)$$

Where p is the percentage which is set to 5% usually; D is the data size, in bits.

Thus, the number of bits per symbol is calculated from the equations (2) and (3).

$$2^n * n = p * D \qquad (4)$$

On the other hand, the encoding ratio is a measure how much the encoded data is against the source data size. The ratio is minimal when the Huffman code is at the minimal length=1. Equation (5) is used to examine the minimal encoding ratio after the number of bits per symbol is determined.

$$r = 1/n * 100\% \qquad (5)$$

r is the minimal encoding ratio which is set to 50% or lower, thus n>2. A lower encoding ratio means a higher Huffman code efficiency.

After taking a first pass through the data to determine which type of dictionary to use and actually creating the dictionary, the encoders will use the dictionary to encode the data. To do this, the input protocol data unit is converted into a bit stream and broken into pieces for each of the parallel encoders. The encoder defines a symbol length n based on the length of the payload and without regard to the number of bits in a byte. The symbol length defines how long each symbol will be that will be encoded using a Huffman coding process. The parallel encoders take n bits of the bit stream to form a symbol, and map the symbol to a code using the Huffman tree or dictionary. Since the number of bits in the symbol is defined without reference to the bytes contained in the bit stream, it is possible and likely that a given symbol may encode only part of a given byte or parts of two or more bytes.

When the input ends, the last symbol is an End of Data symbol. The End of Data symbol may be included as a leaf on the Huffman tree so that, upon receipt of the End of Data symbol, a decoder may determine that the data has ended and that no additional data will need to be decoded using this particular dictionary. Since the End of Data symbol will occur at most once in a dataset, the value $EOD=2^n$ may be used to represent the End of Data. Other symbols may be used for the end of data symbol as well.

Figure 2A:
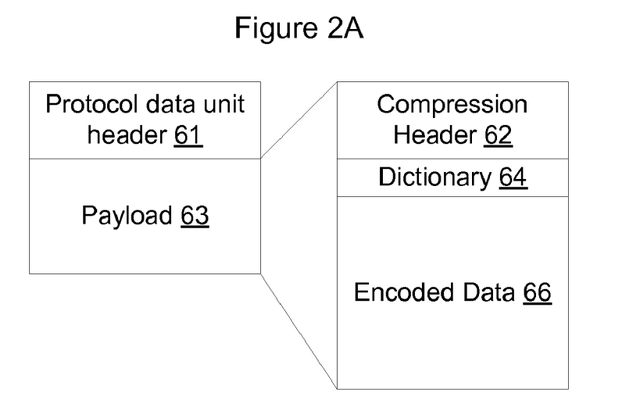
FIG. 2A is a functional block diagram of a protocol data unit having a payload compressed using a static bit-stream Huffman compression process.
Figure 2B:
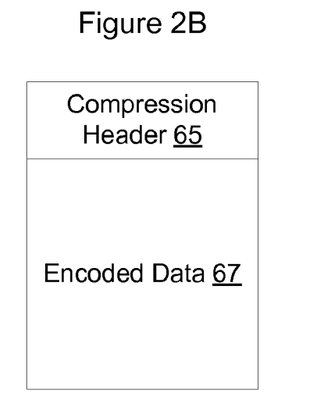
FIG. 2B is a functional block diagram of a payload of a protocol data unit such as the protocol data unit of FIG. 2A in which the payload is compressed using an adaptive bit-stream Huffman compression process.

FIGS. 2A and 2B show how a protocol data unit such as an IP packet or Ethernet frame may be formatted to carry compressed data in the payload field. For example, as shown in FIG. 2A, a common protocol data unit such as an IP packet has a protocol data unit header 61 that is specific to the particular protocol used to form the protocol data unit. In an IP context, the protocol data unit header would be an IP header. Similarly, in an Ethernet context, the protocol data unit header would be an Ethernet header. The protocol data unit also has a payload 63 that is used to carry data. The protocol data unit may also have other fields such as trailing checksum fields, etc., depending on the particular protocol in use.

As shown in FIG. 2, where the payload of the protocol data unit has been compressed, the original payload of the protocol data unit will be replaced with the compressed data. In FIG. 2A, it has been assumed that the compression process used to compress the data was a static Huffman compression process. Accordingly, as shown in FIG. 2A, the payload includes a compression header 62 (discussed in greater detail below) a dictionary 64, and encoded data 66. In FIG. 2B, by contrast, it has been assumed that the compression process that was used to compress the payload data was an adaptive Huffman compression process. In this instance, the compressed data 67 will include information that will allow the decompressor to determine the Huffman tree as it decodes the data. Thus, a dictionary is not required. In either instance, a compression header 62, 65 will be provided to describe the compression process that was used to compress the original data so that the decoder knows how to decompress the encoded data 66, 67. For example, the compression header may include a four bit field specifying the symbol size n. The compression header may also include a bit indicating whether static or adaptive compression was used to compress the data. Where a static compression process was used, the compression header may also include a one bit dictionary type bit indicating the type of dictionary (weighted or canonical) that has been used to encode the data.

When an encoded dataset is to be decoded, the decoder will read the header to determine the symbol size and the type of dictionary used to encode the data. The decoder will then build the Huffman tree from the dictionary and use the tree to determine symbols from the input bit stream. The decoder will map a Huffman code to an n-bit symbol and write out the symbol. The output decoded data will be identical to the original input data.

In another embodiment of the invention, rather than creating a static Huffman tree for a dataset based on the selected symbol size, an adaptive Huffman encoding process may be used in which the Huffman tree is built as symbols are processed. In this embodiment, a symbol does not have a fixed Huffman code. Rather, the Huffman tree is updated as symbols are processed and new symbols are encountered. To do this, a symbol referred to herein as "Not Yet Transmitted (NYT)" is encoded into the data stream whenever a new symbol is encountered. The NYT symbol is followed by a symbol identifying the new symbol. For example, if the symbol size n being used to encode a bit stream has been selected to be 6 bits, then whenever a new 6 bit symbol is found that has not yet been encountered in the bit stream, the encoder would generate the current NYT bit sequence, followed by the six bits of the symbol.

The NYT is a variable length Huffman code that depends on the state of the Huffman tree at the time the NYT is generated. Unlike the static Huffman process, the adaptive Huffman process does not save a Huffman dictionary. Rather, it transmits new symbols dynamically in the form "<NYT, symbol>" along with the encoded data of existing symbols. The NYT code has a variable length which increases as the Huffman tree grows. The maximum length of the NYT code is $2^n$. Thus, in conventional Huffman coding which uses an 8 bit symbol (corresponding to 1 byte), the NYT code will range from 1-to-255 bits in length. Additionally, one NYT code will be required for each symbol present in the dataset. Since the NYT codes are transmitted along with the encoded data, the NYT codes can contribute significant overhead on a small data block. This is similar to the dictionary overhead in static Huffman The bit-stream adaptive Huffman data compression algorithm is proposed to extend the adaptive Huffman algorithm to allow the adaptive Huffman coding process to be used with dynamic symbol size rather than conventional 1-byte symbols. Thus, bit-stream adaptive Huffman treats the input source data as a bit stream instead of a byte array, and dynamically chooses a symbol size having a variable but appropriate number of bits (n-bits). This leads to optimize the number of symbols and accordingly the number of NYT codes, and thus to improve the encoding output. For example, if n=4, there are $2^4=16$ symbols at most. The output uses 16×4 bits or 8 bytes to store 16 symbols, plus a rather small space to store 16 NYTs. For a small data block, this 8+ byte symbol storage is a big saving as compared to the 256+ bytes required for conventional Huffman coding.

By using adaptive Huffman data compression, only one data scan is required to encode a dataset. Thus, the amount of processing required may be reduced over an embodiment where the Huffman dictionary is created prior to encoding the data. Optionally, however, the dataset may first be scanned to enable the tree to be created with training statistics. The dynamic Huffman tree/code may be less efficient at compressing larger datasets, however. Accordingly, the larger datasets may be broken into pieces before being compressed using the adaptive Huffman compression process.

The overhead associated with adaptive Huffman encoding increases as the number of symbol bits increases. Specifically, as the size of the symbol increases, the number of possible symbols increases, and the number and size of NYTs transmitted likewise increases. To calculate the number of bits per symbol that should be used for a particular dataset to encode the dataset using the adaptive Huffman encoding process, suppose that the number of bits per symbol is n and all the $2^n$ symbols are used, the symbol-NYT storage includes:

$2^n*n$ (bits), for all the symbols $2^n*(1+n)/2$ (bits), for all the NYTs, minimal if it's a fully balanced Huffman tree $2^n*(1+2^n)/2$ (bits), maximal if it's a fully imbalanced Huffman tree In total, the minimal storage size (bits) to store the NYT codes is $$S=2^n*(n+(1+n)/2)=2^{n-1}*(1+3n) \quad (1)$$

The measure of the symbol storage is its storage size compared to the data block size.

$$p=S/D \quad (2)$$

Where p is the percentage which is set to 5% usually; D is the data block size, in bits. Thus, the number of bits per symbol is calculated from the equation (3):

$$2^{n-1}*(1+3n)=p*D \quad (3)$$

On the other hand, the encoding ratio is a measure how much the encoded data is against the source data size. The ratio is minimal when the Huffman code is at the minimal length=1. Equation (4) is used to examine the minimal encoding ratio after the number of bits per symbol is determined:

$$r=1/n*100\% \quad (4)$$

r is the minimal encoding ratio which is set to 50% or lower, thus n>2. A lower encoding ratio means a higher data compression efficiency. For network traffic, an IP packet or Ethernet frame may be a common data source. Since these protocol data units have variable length, optionally, for convenience, it may be possible to use the network Maximum Transmission Unit, the input buffer size, or another similar parameter to select the symbol length n.

To encode data using the bit-stream adaptive Huffman encoding, the encoder will first initialize a Huffman tree with or without training statistics. The encoder will look at the size of the dataset to determine the symbol size n, and will input n bits from the bit stream to form a symbol. For a new symbol, the encoder will obtain the current NYT code (which will change as more and more symbols are transmitted) and transmit the NYT and symbol [NYT, symbol] in bits. The encoder will then update the Huffman tree based on the new symbol. For an existing symbol, the encoder will obtain the Huffman code for the symbol, transmit the Huffman code, and update the Huffman tree. The encoder will repeat this process until it reaches the end of the data stream. The encoder will then encode an End of Data symbol to signal that the encoding process has terminated. As with the static Huffman coding, the encoder may perform a size check to ensure that the resultant encoded dataset (coded data plus NYTs) is smaller than the original unencoded dataset.

The adaptive Huffman encoding process will generate a header that is similar to but smaller than the header generated using the static encoding process. The header may contain an indication of the symbol size n as well as an indication that the adaptive Huffman encoding process was used. When the bit-stream adaptive Huffman encoding compression is successful, the output data from bit-stream adaptive Huffman encoding is a bit stream, starting with the encoding header. Then, bit-stream adaptive Huffman encoding aggregates the encoding header bits and the data code bits transmitted from the above data encoding process into bytes. When a byte is formed, bit-stream adaptive Huffman encoding writes it out to a data file or a network buffer. At the end, the bit-stream adaptive Huffman encoding may add a number of "0" bits to form the last byte when necessary.

To decode data that has been encoded using the adaptive Huffman encoding process, the decoder will first initialize a Huffman tree with or without training statistics. The initial Huffman tree may have only a NYT node since no symbols have been transmitted at that point in time. After the header, the decoder will read the encoded bit stream to look for the NYT code. When the first NYT code is found, the decoder will read the associated symbol and update the Huffman tree. As part of this process, the NYT code will be changed based on the updated Huffman tree. The decoder will repeat the read process to look for known Huffman codes and NYT codes. Each time a known Huffman code is located, the associated symbol will be written. If a NYT code is received, the new symbol will be written and the Huffman tree will be updated. As new symbols are received, the decoder will increase the symbol count and update the Huffman tree. If the Huffman code is not a NYT code, the decoder will map the code to an n-bit symbol and write out the symbol. When the decoder receives an End of Data symbol, it will stop decoding.

The hardware shown in FIG. 5 may use either the adaptive Huffman encoding and decoding process or the static Huffman encoding and decoding process. The controller 530 breaks large datasets 500 into appropriately sized pieces 501 for parallel encoding. The controller 530 also analyzes encoded datasets 500' to determine if the encoded dataset 500' contains separately coded pieces 501'. Where the dataset contains separately coded pieces 501', the controller causes the separately compressed pieces 501' to be separately decompressed, optionally in parallel, using parallel decompression processes.

The encode logic programs the processor to view the data received from the input buffer as a bit stream and determine the bit number or length of the symbol to be used in the Huffman compression process based on the length of the piece of data 501 that is to be separately compressed. The encode logic also programs the processor to select either a static Huffman compression process or an adaptive Huffman compression process to be used to compress the data. Where a static Huffman compression process is used, the encode logic further programs the processor to select either a canonical or weighted dictionary to be provided along with the compressed data. These parameters associated with the compression process that was used to compress the dataset are then provided in a header to enable the data to be later decompressed.

The functions described herein may be implemented as a set of program instructions that are stored in a computer readable memory and executed on one or more processors on a computer platform. However, it will be apparent to a skilled artisan that all logic described herein can be embodied using discrete components, integrated circuitry such as an Application Specific Integrated Circuit (ASIC), programmable logic used in conjunction with a programmable logic device such as a Field Programmable Gate Array (FPGA) or microprocessor, a state machine, or any other device including any combination thereof. Programmable logic can be fixed temporarily or permanently in a tangible medium such as a read-only memory chip, a computer memory, a disk, or other storage medium.

It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A method of bit-stream Huffman coding for data compression, the method comprising the steps of:
    obtaining a dataset to be compressed, the dataset containing a plurality of bytes of data, each byte having a same number of bits;
    defining a symbol length based on a length of the dataset, the symbol length defining a length of symbols to be used in a Huffman coding process to compress the data of the dataset, the symbol length being defined without regard to the number of bits in a byte;
    converting the dataset to a bit stream;
    encoding the bit stream using the Huffman coding process by extracting symbols with the defined symbol length from the bit stream and outputting Huffman codes corresponding to the extracted symbols to generate a compressed dataset.

2. The method of claim 1, wherein the dataset contains a plurality of bytes of data, each of which is eight bits in length.

3. The method of claim 2, wherein the symbol length is defined dynamically by assessing the length of the dataset and choosing a symbol length that will approximately 5% overhead.

4. The method of claim 3, wherein the Huffman coding process is a static Huffman coding process and the overhead represents a storage size of a Huffman dictionary for the Static Huffman coding process.

5. The method of claim 4, further comprising generating a compression header for the compressed dataset, the compression header including a four bit field identifying the symbol length in bits, and a 1-bit field identifying a Huffman dictionary type.

6. The method of claim 5, further comprising generating a network protocol data unit having a protocol data unit header and payload portion, and wherein the payload portion carries the compression header and compressed dataset.

7. The method of claim 2, wherein the Huffman coding process is an adaptive Huffman coding process and the overhead represents the storage size of Not Yet Transmitted codes for the adaptive Huffman coding process.

8. The method of claim 7, further comprising generating a compression header for the compressed dataset, the compression header including a four bit field identifying the symbol length in bits, and a 1-bit field identifying the Huffman coding process as an adaptive Huffman coding process.

9. The method of claim 8, further comprising generating a network protocol data unit having a protocol data unit header and payload portion, and wherein the payload portion carries the compression header and compressed dataset.

10. The method of claim 1, wherein the Huffman coding process is a static bit-stream compression process.

11. The method of claim 1, wherein the Huffman coding process is an adaptive bit-stream compression process.

12. The method of claim 1, wherein the symbol length used in the Huffman coding process is longer than a byte, in bits.

13. The method of claim 1, wherein the symbol length used in the Huffman coding process is shorter than a byte, in bits.

14. The method of claim 1, further comprising dividing the dataset into a plurality of pieces, and wherein the steps of defining a symbol length, converting the dataset to a bit stream, and encoding the bit stream, is performed individually on each of the pieces such that the compressed dataset includes several individually compressed pieces of the original dataset.

15. The method of claim 14, wherein a static Huffman coding process is used on the pieces such that each compressed piece of the original dataset includes its own dictionary.

16. The method of claim 1, wherein the dataset to be compressed is the payload of a protocol data unit.

17. A network element including a bitstream Huffman encoder, the bitstream Huffman encoder comprising:
    a plurality of input buffers to store pieces of data to be individually encoded;
    a plurality of processors to individually implement Huffman coding processes to encode the pieces of data stored in the input buffers; and
    a plurality of output buffers to store encoded pieces of data generated by the processors;
    wherein each of the processors encodes a piece of data by:
        assessing a length of the piece of data to be encoded;
        defining a symbol length based on the length of the data to be encoded, the symbol length defining a length of symbols to be used in the Huffman coding process being used by the processor to compress the piece of data to be encoded, the symbol length being defied without regard to the number of bits in a byte; and
        encoding the data to be encoded using the Huffman coding process by extracting symbols with the defined symbol length from the data to be encoded and outputting Huffman codes corresponding to the extracted symbols to generate a compressed dataset.

18. A network element including a bitstream Huffman encoder, the bitstream Huffman encoder comprising:
    a deassembler to break an input dataset into the plurality of pieces of data;
    a plurality of input buffers to store pieces of data to be individually encoded;
    a plurality of processors to individually implement Huffman coding processes to encode the pieces of data stored in the input buffers; and a plurality of output buffers to store encoded pieces of data generated by the processors; and an assembler to assemble the individually encoded pieces into a compressed dataset;

wherein each of the processors encodes a piece of data by assessing a length of the data, using the length to determine a symbol length to be used by the Huffman coding process for that particular piece of data.

19. A network element including a bitstream Huffman decoder, the bitstream Huffman decoder comprising:

a plurality of input buffers to store pieces of data that have been previously individually encoded using separate Huffman encoding processes;

a plurality of processors to individually implement Huffman decoding processes to individually decode the pieces of data stored in the input buffers; and a plurality of output buffers to store decoded pieces of data generated by the processors;

wherein each of the processors decodes a piece of data by determining from a compression header associated with the individually encoded piece of data a symbol length that was used by the Huffman encoding process to encode that particular piece of data, and then implements a Huffman decoding process to output symbols having the determined symbol length.

20. The network element of claim 19, further comprising a deassembler to break an input dataset into the pieces of data that have been previously individually encoded, and an assembler to assemble the individually decoded pieces into a decoded dataset.

* * * * *